United States Patent [19]
Lur et al.

[11] Patent Number: 5,716,888
[45] Date of Patent: Feb. 10, 1998

[54] STRESS RELEASED VLSI STRUCTURE BY VOID FORMATION

[75] Inventors: Water Lur; Jenn-Tarng Lin, both of Taipei; Her-Song Liaw, Yunlin, all of Taiwan

[73] Assignee: United Microelectronics Corporation, Hsin-Chu, Taiwan

[21] Appl. No.: 654,779

[22] Filed: May 29, 1996

Related U.S. Application Data

[63] Continuation of Ser. No. 411,052, Mar. 27, 1995, abandoned, which is a continuation of Ser. No. 83,481, Jun. 30, 1993, abandoned.

[51] Int. Cl.$^6$ .................................................. H01L 21/56
[52] U.S. Cl. .................... 438/619; 438/699; 438/787; 438/958; 438/668
[58] Field of Search .................... 437/195, 927, 437/235; 148/DIG. 73, DIG. 81; 438/619, 626, 699, 787, 958, 668

[56] References Cited

U.S. PATENT DOCUMENTS

| | | | |
|---|---|---|---|
| 5,099,304 | 3/1992 | Takemura et al. | 357/49 |
| 5,119,164 | 6/1992 | Sliwa, Jr. et al. | 357/54 |
| 5,192,715 | 3/1993 | Sliwa, Jr. et al. | |
| 5,217,926 | 6/1993 | Langley | 437/228 |
| 5,278,103 | 1/1994 | Mallon et al. | 437/240 |
| 5,290,358 | 3/1994 | Rubloff et al. | 118/715 |
| 5,310,700 | 5/1994 | Lien et al. | 437/195 |
| 5,407,860 | 4/1995 | Stoltz et al. | 437/180 |
| 5,517,062 | 5/1996 | Lur et al. | 257/760 |
| 5,545,919 | 8/1996 | Ueda et al. | 257/641 |

FOREIGN PATENT DOCUMENTS

| | | |
|---|---|---|
| 63-111651 | 5/1988 | Japan . |
| 63-232447 | 9/1988 | Japan . |

OTHER PUBLICATIONS

S. Wolf "*Silicon Processing for the VLSI Era*" vol. 2 (1990) Lattice Press, Calif. pp. 196–199 and pp. 206–214.

Ronald R. Uttecht et al. "A Four–Level–Metal Fully Planarized Interconnect Technology" Proc. 8th International IEEE VLSI Multilevel Interconnect Conf. (1991). pp. 20–26.

S. Wolf, Silicon Processing, vol. 2, 1990, Lattice Press (Calif. USA). pp. 206, 212, 199.

*Primary Examiner*—John Niebling
*Assistant Examiner*—C. Everhart
*Attorney, Agent, or Firm*—William H. Wright

[57] ABSTRACT

A new method of forming controlled voids within the intermetal dielectric and within the passivation layer of an integrated circuit is achieved. A first layer of patterned metallization is provided over semiconductor device structures in and on a semiconductor substrate. An intermetal dielectric layer is deposited overlying the first patterned metal layer wherein the thickness of the intermetal dielectric layer is large enough so as to cause the formation of voids within the intermetal dielectric and wherein said voids are completely covered by said intermetal dielectric. A second layer of metallization is deposited over the intermetal dielectric and patterned. A passivation layer is deposited overlying the second patterned metal layer. The thickness of the passivation layer is large enough so as to cause the formation of voids within the passivation layer wherein said voids are completely covered by said passivation layer. The thermal stresses are released by the voids within the intermetal dielectric and within the passivation layer of the integrated circuit.

19 Claims, 1 Drawing Sheet

STRESS RELEASED VLSI STRUCTURE BY VOID FORMATION

This is a continuation of application Ser. No. 08/411,052, filed Mar. 27, 1995 and now abandoned, which was a continuation of application Ser. No. 08/083,481, filed Jun. 30, 1993, now abandoned.

RELATED PATENT (1) U.S. Pat. No. 5,393,709 issued on Feb. 28, 1995 to Water Lur and J. Y. Wu entitled, "Stress Released VLSI Structure By the Formation of Porous Intermetal Layer."

BACKGROUND OF THE INVENTION

1. Field of the Invention

The invention relates to a method of reducing thermal stress after metallization in an integrated circuit device, and more particularly, to a method of reducing thermal stress after metallization by controlled void formation within the intermetal dielectric and passivation layers of an integrated circuit device.

2. Description of the Prior Art

Conventional integrated circuit processes are designed to be void free in the layered structure before and after metal deposition to avoid the electro/stress migration of metal. For example, U.S. Pat. No. 5,099,304 to Takemura et al discloses the formation of voids in Prior Art (FIG. 2a) as being undesirable.

However, the stress inherently comes from the thermal coefficient difference of expansion between the layers. The stress in a layer can be represented by the following:

$$S_r = (a_f - a_s)(T_f - T_o)E$$

where $S_r$ is the stress of the current layer measured at room temperature, $a_f$ and $a_s$ are thermal coefficients of expansion for this layer and the substrate, respectively (substrate here is defined to be the combination of all layers, including the silicon wafer, under this layer)

$T_f$ is the temperature of the layer to be thermally treated, or the formation temperature, $T_o$ is room temperature, i.e. stress measuring temperature, and E is Young's modulus of film.

Therefore, all thermal cycles result in thermal stress in each layer as well as in all underlying layers. The stress can be up to $5 \times 10^9$ dynes/cm$^2$ and even larger. The relaxation of stress results in metal failure, dielectric cracking, and defects in the silicon substrate.

The intermetal dielectric is a critical layer in the fabrication of submicron multilevel VLSI circuits. The sandwich structure of silicon oxide and spin-on-glass is widely used to form the intermetal dielectric. Referring to FIG. 1, there is shown a portion of an integrated circuit of the conventional prior art process. Field oxide region 12 has been formed in and on semiconductor substrate 10. Device structures such as gate electrodes 14 and source/drain regions 15 have been formed. Contact or via openings are formed through an insulating layer 16 to the semiconductor substrate 10 and elsewhere as shown in FIG. 1. A first metal 20 is deposited and patterned to complete the contacts. The typical sandwich structure of silicon oxide 21, spin-on-glass 23, and silicon oxide 25 is shown. Openings are made through this intermetal dielectric sandwich 21/23/25 to the first metal layer 20. A second metallization 30 is deposited and patterned. Passivation layer 31 is deposited over the patterned metal layer.

U.S. Pat. No. 5,119,164 to Sliwa, Jr. et al describes a method of forming voids within a spin-on-glass layer to relieve stresses leading to cracking of the spin-on-glass layer. However, spin-on-glass cannot adequately fill some of the small spaces existing in the submicron regime. In addition, there are other drawbacks associated with using spin-on-glass as the intermetal dielectric, such as moisture outgassing, via leakage, and field inversion. It is desirable to use a material other than spin-on-glass for the intermetal dielectric for submicron VLSI integrated circuits.

SUMMARY OF THE INVENTION

A principal object of the present invention is to provide an effective and very manufacturable method of reducing thermal stress after metallization in an integrated circuit.

Another object of the present invention is to provide a method of reducing thermal stress by forming voids within the intermetal dielectric of an integrated circuit.

Yet another object of the invention is to provide a method of reducing thermal stress by forming voids within the passivation layer of an integrated circuit.

In accordance with the objects of this invention a new method of forming controlled voids within the intermetal dielectric and within the passivation layer of an integrated circuit is achieved. A first layer of patterned metallization is provided over semiconductor device structures in and on a semiconductor substrate. An intermetal dielectric layer is deposited overlying the first patterned metal layer wherein the thickness of the intermetal dielectric layer is large enough so as to cause the formation of voids within the intermetal dielectric and wherein said voids are completely covered by said intermetal dielectric. A second layer of metallization is deposited over the intermetal dielectric and patterned. A passivation layer is deposited overlying the second patterned metal layer. The thickness of the passivation layer is large enough so as to cause the formation of voids within the passivation layer wherein said voids are completely covered by said passivation layer. The thermal stresses are released by the voids within the intermetal dielectric and within the passivation layer of the integrated circuit.

BRIEF DESCRIPTION OF THE DRAWINGS

In the accompanying drawings forming a material part of this description, there is shown.

DESCRIPTION OF THE PREFERRED EMBODIMENTS

Figure 1:
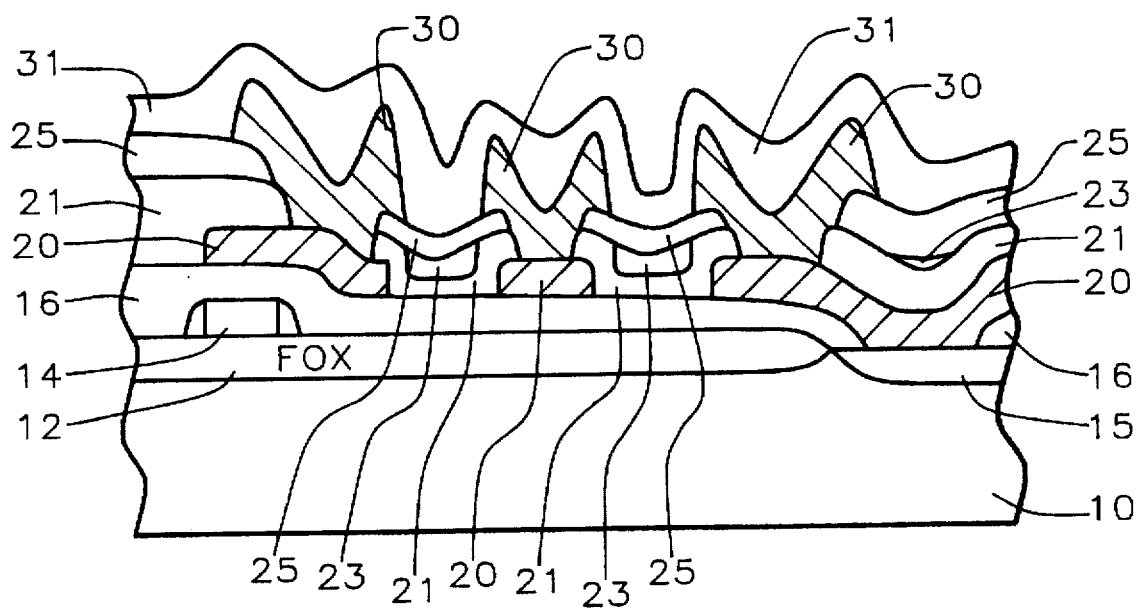
FIG. 1 schematically illustrates in cross-sectional representation the conventional prior art process.
Figure 2:
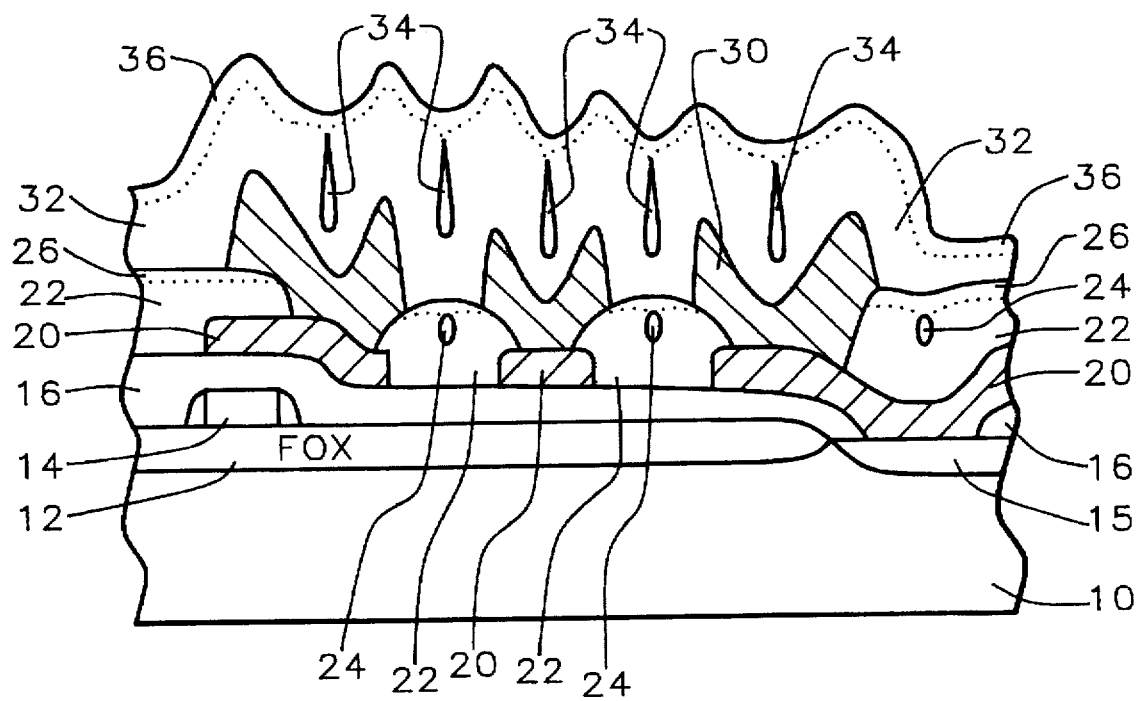
FIG. 2 schematically illustrates in cross-sectional representation a preferred embodiment of the present invention.

Referring now more particularly to FIG. 2, the process of the present invention will be described. A portion of a partially completed integrated circuit is illustrated in FIG. 2 consisting of a semiconductor substrate 10, preferably composed of monocrystalline silicon. Field oxide region 12 has been formed in the semiconductor substrate 10. Semiconductor device structures such as gate electrodes 14 and source/drain regions 15 are formed as is conventional in the art. A passivation or insulating layer 16 is then formed over the surfaces of the patterns. This layer may be composed of multilayers such as a thin layer of silicon oxide and a much thicker layer of borophosphosilicate glass (BPSG) or phosphosilicate glass. The glasseous layer 16 is flowed as is conventional in the art to planarize the surface of the wafer.

Contact openings are formed through the insulating layer 16 to the semiconductor substrate 10 and elsewhere as illustrated in FIG. 2 using conventional lithography and etching techniques. A first metal layer 20 is deposited and patterned to complete the contacts.

Now the intermetal dielectric layer is formed. This layer may be plasma enhanced chemical vapor deposited (PECVD) or atmospheric pressure chemical vapor deposited (APCVD) silicon oxide and/or nitride, as long as it is a poor step coverage deposition. Voids 24 will be formed within the dielectric 22. The voids will be formed above the metal lines, as shown in FIG. 2. The voids must be closed at the top, so an overfill 26 must be used to cover the voids. The metal lines should be fully wrapped by the dielectric 22 to maintain metal line integrity. The dielectric thickness must be large enough to prevent the formation of hillocks and cracks in the metal lines and the prevent moisture attack. On the other hand, the thickness must be small enough to provide a "soft envelope" for the metal lines to release thermal stress during subsequent processes. The typical dielectric thickness required is between about 1,000 to 3,000 Angstroms.

The critical thickness of dielectric 22 required to form voids 24 is equal to half the metal line spacing for a step coverage of less than 100%. For example, if the metal spacing or opening size is 0.5 microns and the thickness of the metal layer is 0.6 microns, the aspect ratio for the dielectric deposition will be larger than 1.2. The critical thickness of the dielectric 22 on the metal lines should be 2,500 Angstroms. In addition to the critical thickness of the dielectric 22 on the metal lines to form voids inside the openings, more dielectric is necessary for the formation of an intermetal layer with low enough capacitance. The final thickness of the intermetal dielectric depends on the applied voltage drop between over and underlying conducting layers and the requirement of circuit performance. Typically, it is slightly larger than that of the underlying metal layer.

The step coverage of this layer 22 should be tuned to be 40–80% in this kind of topography to form voids inside the metal openings with size of between about 0.1 to 0.3 microns. The minimum and maximum step coverages of the dielectric 22 can be represented as follows:

$$SCD_{min} = T_{min} * 2/S_{met}$$

$$SCD_{max} = (S_{met} - V_{min})/S_{met}$$

where $SCD_{min}$ and $SCD_{max}$ are the required minimum and maximum step coverages of the dielectric 22, respectively. $T_{min}$ is the minimum thickness of dielectric 22 and $V_{min}$ is the minimum size of voids. $S_{met}$ is the spacing of the metal lines.

If the metal opening is too small, less than about 0.3 microns in devices with feature size of 0.25 microns, a dielectric layer with a large step coverage of about 80% is needed to provide the minimum dielectric thickness. If the metal opening is very large, it is difficult to get a small step coverage deposition and there would be no voids formed. However, there would be no metal lines in that area to cause the thermal stress problem Furthermore, some idle metal line could be designed there to form some small openings and some intended voids. For example, for openings in the metal layer of between about 0.3 to 1.5 microns, the total thickness of the intermetal dielectric layer should be between about 3,000 to 10,000 Angstroms. With suitable step coverage, voids of between about 0.05 to 1.3 microns will be formed.

Contact or via openings are formed through the intermetal dielectric layer 22/26 to the first metal layer 20 using conventional lithography and etching techniques. A second metal layer 30 is deposited and patterned to complete the second layer of metallization.

The passivation layer 32 may be PECVD or APCVD silicon oxide and/or nitride, as was the intermetal dielectric layer 22. Voids 34 are formed as described above and overfilled 36 so that the voids are closed on top. In addition to the critical thickness of the dielectric or passivation layer 32 to form voids as described above, more dielectric is necessary to prevent humidity erosion and mechanical damage. It is important to have voids at each dielectric layer to release stress in the whole system. The voids will be formed above the top surface of the metal lines and may be formed above the openings between the metal lines, as are voids 24.

The voids 24 and 34 within the intermetal dielectric and passivation layers, respectively, allow for the release of thermal stress within the integrated circuit. This is especially important for devices with critical dimensions in the half micron and sub-half micron area where the aspect ratio of metal spacing is larger than one. Except for the top metal layer, the thicknesses of all Aluminum alloy layers are limited to be between about 5,000 to 8,000 Angstroms to meet the requirements for circuit performance. Usually, the smallest thickness is adopted to minimize step height for the deposition of subsequent layers. For devices with the feature size of half micron and sub-half micron, the openings between metal lines will be shrunk to 0.5 microns or less to minimize the layout area. However, the thickness of the metal lines must be kept over the requirement of current density and cannot be shrunk as much as the width. The aspect ratio of the metal openings will be larger than one. It is difficult to fill these openings using conventional spin-on-glass, but easy to deposit a thin film with step coverage less than 100% into openings with aspect ratio larger than one. When the aspect ratio is smaller than one, the openings are very large. Voids may be formed by designing idle metal lines in these area, as described above.

Where narrow spacing is required for feature size of less than 0.5 microns, the stress-releasing process of the present invention, in both the intermetal dielectric and passivation layers, is particularly important. At higher feature sizes, greater than 0.5 microns, narrow spacing can be formed by layout design and the resulting stress released by the process herein disclosed. The dielectric constant of void is one resulting in a smaller RC constant, and hence, an improved signal transient speed. The thermal stress of circuits with voids formed by the process of the invention is smaller than the thermal stress of circuits without voids by two or three orders of magnitude.

While the invention has been particularly shown and described with reference to the preferred embodiments thereof, it will be understood by those skilled in the art that various changes in form and details may be made without departing from the spirit and scope of the invention.

What is claimed is:

1. The method of forming stress releasing voids in the intermetal dielectric of an integrated circuit comprising:
   providing at least a first patterned metal layer having openings between metal lines over semiconductor device structures in and on a semiconductor substrate;
   depositing a silicon oxide and/or nitride intermetal dielectric layer overlying said first patterned metal layer wherein the deposition conditions and the thickness of said intermetal dielectric layer cause the formation of voids within said intermetal dielectric layer above openings between metal lines and entirely above the adjacent upper surfaces of said metal lines, wherein said voids are completely covered by said intermetal dielectric layer and wherein said voids are permanently placed upon formation; and depositing a second metal layer over said intermetal dielectric layer wherein thermal stresses experienced by said integrated circuit after said second metal layer is deposited are reduced by said voids within said intermetal dielectric.

2. The method of claim 1 wherein said openings in said metal layer are between about 0.3 to 1.5 microns and said intermetal dielectric layer is chemical vapor deposited silicon oxide to a thickness of between about 3,000 to 10,000 Angstroms wherein said voids are formed.

3. The method of claim 2 wherein said voids are formed by the deposition of said intermetal dielectric layer with suitable step coverage to the size of between about 0.05 to 1.3 microns.

4. The method of claim 1 wherein said intermetal dielectric layer is chemical vapor deposited silicon nitride to a thickness of between about 3,000 to 10,000 Angstroms.

5. The method of claim 1 wherein said openings in said metal layer are between about 0.3 to 1.5 microns and said intermetal dielectric layer is chemical vapor deposited silicon oxynitride to a thickness of between about 3,000 to 10,000 Angstroms.

6. The method of claim 1 wherein said openings in said metal layer are between about 0.3 to 1.5 microns and said intermetal dielectric layer is composed of one or more than one layer of chemical vapor deposited silicon oxide, silicon nitride, and silicon oxynitride to a total thickness of between about 3,000 to 10,000 Angstroms.

7. The method of claim 1 wherein said openings in said metal layer are between about 0.3 to 1.5 microns and said intermetal dielectric layer is composed of one or more than one layer of physical vapor deposited silicon oxide, silicon nitride, and silicon oxynitride to a total thickness of between about 3,000 to 10,000 Angstroms.

8. The method of claim 1 wherein said thermal stresses experienced by said substrate in the presence of voids are smaller that the thermal stresses experienced by said substrate in the absence of voids by two to three orders of magnitude.

9. The method of forming stress releasing voids in the passivation layer of an integrated circuit comprising:

providing a plurality of patterned metallization layers over semiconductor device structures in and on a semiconductor substrate wherein topmost of said patterned metallization layers has openings between metal lines;

depositing a silicon oxide and/or nitride passivation layer overlying said topmost patterned metallization layer wherein the deposition conditions and the thickness of said passivation layer cause the formation of voids within said passivation layer and extending vertically above said openings between said metal lines and above adjacent upper surfaces of said wiring lines and extending vertically over at least half of the thickness of said passivation layer between said adjacent upper surfaces of said wiring lines and an upper surface of said passivation layer, wherein said voids are completely covered by said intermetal dielectric and wherein said voids are permanently placed upon formation; and completing fabrication of said integrated circuit wherein thermal stresses experienced by said substrate are reduced by voids within said passivation layer.

10. The method of claim 9 said openings in said patterned metallization layer are between about 0.5 to 3.0 microns and wherein said passivation layer is chemical vapor deposited silicon oxide to a thickness of between about 3,000 to 30,000 Angstroms wherein said voids are formed.

11. The method of claim 10 wherein said voids are formed by the deposition of said passivation layer with suitable step coverage to the size of between about 0.05 to 2.8 microns.

12. The method of claim 9 wherein said openings in said patterned metallization layer are between about 0.5 to 3.0 microns and said passivation layer is chemical vapor deposited silicon nitride to a thickness of between about 3,000 to 30,000 Angstroms.

13. The method of claim 9 wherein said openings in said patterned metallization layer are between about 0.5 to 3.0 microns and said passivation layer is chemical vapor deposited silicon oxynitride to a thickness of between about 3,000 to 30,000 Angstroms.

14. The method of claim 9 wherein said openings in said patterned metallization layer are between about 0.5 to 3.0 microns and wherein said passivation layer is composed of one or more than one layer of chemical vapor deposited silicon oxide, silicon nitride, and silicon oxynitride to a thickness of between about 3,000 to 30,000 Angstroms.

15. The method of claim 9 wherein said openings in said patterned metallization layer are between about 0.5 to 3.0 microns and wherein said passivation layer is composed of one or more than one layer of physical vapor deposited silicon oxide, silicon nitride, and silicon oxynitride to a thickness of between about 3,000 to 30,000 Angstroms.

16. A method according to claim 1 wherein said voids are formed above said openings and above the top surface of said metal lines.

17. A method according to claim 1 wherein said step coverage is within the range defined by the following formula:

minimum step coverage is equal to twice the minimum thickness of said intermetal dielectric layer divided by the spacing between said metal lines; and maximum step coverage is equal to the difference between said spacing between said metal lines and the minimum size of said voids divided by said spacing between metal lines.

18. A method according to claim 9 wherein said voids are formed above said openings and above the top surface of said metal lines.

19. A method according to claim 9 wherein said step coverage is within the range defined by the following formula:

minimum step coverage is equal to twice the minimum thickness of said intermetal dielectric layer divided by the spacing between said metal lines; and maximum step coverage is equal to the difference between said spacing between said metal lines and the minimum size of said voids divided by said spacing between metal lines.

* * * * *